(12) United States Patent
Qing (10) Patent No.: US 11,127,478 B2
(45) Date of Patent: Sep. 21, 2021

(54) SHIFT REGISTER UNIT AND DRIVING METHOD THEREOF, GATE DRIVING CIRCUIT, AND DISPLAY DEVICE

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventor: Haigang Qing, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/633,277

(22) PCT Filed: Jul. 10, 2019

(86) PCT No.: PCT/CN2019/095478
§ 371 (c)(1),
(2) Date: Jan. 23, 2020

(87) PCT Pub. No.: WO2020/015569
PCT Pub. Date: Jan. 23, 2020

(65) Prior Publication Data
US 2020/0152283 A1 May 14, 2020

(30) Foreign Application Priority Data

Jul. 16, 2018 (CN) .......................... 201810778019.7

(51) Int. Cl.
*G11C 19/28* (2006.01)
*G09G 3/36* (2006.01)
*G09G 3/3266* (2016.01)

(52) U.S. Cl.
CPC ........... *G11C 19/28* (2013.01); *G09G 3/3266* (2013.01); *G09G 3/3677* (2013.01); *G09G 2300/0408* (2013.01); *G09G 2310/0286* (2013.01)

(58) Field of Classification Search
CPC ............... G09G 3/3266; G09G 3/3677; G09G 2300/0408; G09G 2310/0286; G09G 2310/08; G11C 19/28
See application file for complete search history.

(56) References Cited

U.S. PATENT DOCUMENTS 9,786,228 B2 * 10/2017 Ma ........................ G11C 19/287
10,482,812 B1 * 11/2019 Zhai ........................ H03K 3/017
(Continued)

FOREIGN PATENT DOCUMENTS

| CN | 104282255 A | 1/2015 |
| CN | 104409045 A | 3/2015 |

(Continued)

OTHER PUBLICATIONS

First Office Action issued by the Chinese Patent Office in the priority Chinese application No. 201810778019.7 dated Dec. 13, 2019.

*Primary Examiner* — Patrick O Neill
(74) *Attorney, Agent, or Firm* — Dilworth & Barrese, LLP.; Michael J. Musella, Esq.

(57) ABSTRACT

A shift register unit, a gate driving circuit, a display device, and a driving method are disclosed. The shift register unit includes an input circuit, a first control circuit, and an output circuit. The input circuit is configured to receive an input signal and control a level of a first control node according to the input signal and in response to a first clock signal; the first control circuit is configured to control a level of a first node under control of the level of the first control node and the first clock signal; and the output circuit is configured to (Continued)

receive a first voltage of a first voltage terminal and output the first voltage to an output terminal under control of the level of the first node.

19 Claims, 7 Drawing Sheets

(56) References Cited

U.S. PATENT DOCUMENTS

| | | | |
|---|---|---|---|
| 10,629,108 B2 * | 4/2020 | Xuan | ............... G09G 3/3677 |
| 10,923,040 B2 * | 2/2021 | Um | ............... H01L 27/3276 |
| 2002/0150199 A1 | 10/2002 | Sasaki et al. | |
| 2009/0167668 A1 | 7/2009 | Kim | |
| 2016/0189626 A1 | 6/2016 | Sun | |
| 2017/0200419 A1 | 7/2017 | Ma | |
| 2017/0330633 A1 | 11/2017 | Sun et al. | |
| 2018/0174521 A1 | 6/2018 | Zheng et al. | |
| 2019/0073933 A1 | 3/2019 | Xuan | |
| 2019/0236994 A1 | 8/2019 | Feng et al. | |
| 2019/0304559 A1 | 10/2019 | Wang | |

FOREIGN PATENT DOCUMENTS

| | | | |
|---|---|---|---|
| CN | 104809978 A | 7/2015 | |
| CN | 104835450 A | 8/2015 | |
| CN | 104933990 A | 9/2015 | |
| CN | 105304057 A | 2/2016 | |
| CN | 105609041 A | 5/2016 | |
| CN | 105741744 A | 7/2016 | |
| CN | 106887209 A | 6/2017 | |
| CN | 107464539 A | 12/2017 | |
| CN | 108133694 A | 6/2018 | |
| CN | 108281123 A | 7/2018 | |
| CN | 108281124 A | 7/2018 | |

* cited by examiner

SHIFT REGISTER UNIT AND DRIVING METHOD THEREOF, GATE DRIVING CIRCUIT, AND DISPLAY DEVICE

The application claims priority to Chinese patent application No. 201810778019.7, filed on Jul. 16, 2018, the entire disclosure of which is incorporated herein by reference as part of the present application.

TECHNICAL FIELD

Embodiments of the present disclosure relate to a shift register unit and a driving method thereof, a gate driving circuit, and a display device.

BACKGROUND

In a field of display technology, for example, a pixel array of a liquid crystal display panel generally includes a plurality of rows of gate lines and a plurality of columns of data lines crisscrossed with the plurality of rows of gate lines. The gate lines can be driven by a bonding integrated driving circuit. In recent years, with continuous improvement of a manufacturing process of amorphous silicon thin film transistors, oxide thin film transistors and low-temperature poly-silicon thin film transistors, the gate line driving circuit can also be directly integrated on the thin film transistor array substrate to form a GOA (Gate driver On Array) to drive the gate lines. For example, the GOA including a plurality of cascaded shift register units can be used to provide switching voltage signals for the plurality of rows of gate lines of the pixel array, thereby controlling, for example, the plurality of rows of gate lines to be sequentially turned on, and data lines can be used to provide data signals for a corresponding row of pixel units in the pixel array to form gray voltages required for each gray level of a display image in each of the pixel units, thereby displaying a frame of image. Current display panels increasingly use GOA technology to drive gate lines. The GOA technology benefits to implementing a narrow frame design of the display panel, and can reduce the production cost of the display panel.

SUMMARY

At least one embodiment of the present disclosure provides a shift register unit, including an input circuit, a first control circuit, and an output circuit. The input circuit is configured to receive an input signal and control a level of a first control node according to the input signal in response to a first clock signal; the first control circuit is configured to control a level of a first node under control of the level of the first control node and the first clock signal; and the output circuit is configured to receive a first voltage of a first voltage terminal and output the first voltage to an output terminal under control of the level of the first node.

For example, in the shift register unit provided by an embodiment of the present disclosure, the first control circuit includes a second node control sub-circuit, a second control node control sub-circuit, a second control sub-circuit, and a first node control sub-circuit. The second node control sub-circuit is configured to control a level of a second node under control of the level of the first control node and the first clock signal; the second control node control sub-circuit is configured to control a level of a second control node under control of the level of the first control node and the level of the second node; the second control sub-circuit is configured to control the level of the first control node under control of the level of the second control node; and the first node control sub-circuit is configured to control the level of the first node under control of the level of the first control node and the level of the second control node.

For example, in the shift register unit provided by an embodiment of the present disclosure, the input circuit includes a first transistor, a gate electrode of the first transistor is connected to a first clock signal terminal to receive the first clock signal, a first electrode of the first transistor is connected to an input terminal to receive the input signal, and a second electrode of the first transistor is connected to the first control node.

For example, in the shift register unit provided by an embodiment of the present disclosure, the output circuit includes a second transistor, a gate electrode of the second transistor is connected to the first node, a first electrode of the second transistor is connected to the first voltage terminal to receive the first voltage, and a second electrode of the second transistor is connected to the output terminal.

For example, in the shift register unit provided by an embodiment of the present disclosure, the second node control sub-circuit includes a third transistor and a first capacitor. A gate electrode of the third transistor is connected to the first control node, a first electrode of the third transistor is connected to the first voltage terminal to receive the first voltage, and a second electrode of the third transistor is connected to the second node; and a first electrode of the first capacitor is connected to a first clock signal terminal to receive the first clock signal, and a second electrode of the first capacitor is connected to the second node.

For example, in the shift register unit provided by an embodiment of the present disclosure, the second control node control sub-circuit includes a fourth transistor, a fifth transistor, and a second capacitor. A gate electrode of the fourth transistor is connected to the first control node, a first electrode of the fourth transistor is connected to the first voltage terminal to receive the first voltage, and a second electrode of the fourth transistor is connected to the second control node; a gate electrode of the fifth transistor is connected to the second node, a first electrode of the fifth transistor is connected to a second voltage terminal to receive a second voltage, and a second electrode of the fifth transistor is connected to the second control node; and a first electrode of the second capacitor is connected to the second control node, and a second electrode of the second capacitor is connected to the first node.

For example, in the shift register unit provided by an embodiment of the present disclosure, the second control sub-circuit includes a sixth transistor, a gate electrode of the sixth transistor is connected to the second control node, a first electrode of the sixth transistor is connected to the first voltage terminal to receive the first voltage, and a second electrode of the sixth transistor is connected to the first control node.

For example, in the shift register unit provided by an embodiment of the present disclosure, the first node control sub-circuit includes a seventh transistor, an eighth transistor, and a third capacitor. A gate electrode of the seventh transistor is connected to the second control node, a first electrode of the seventh transistor is connected to a second clock signal terminal to receive a second clock signal, and a second electrode of the seventh transistor is connected to the first node; a gate electrode of the eighth transistor is connected to the first control node, a first electrode of the eighth transistor is connected to the first voltage terminal to receive the first voltage, and a second electrode of the eighth transistor is connected to the first node; and a first electrode of the third capacitor is connected to the first node, and a second electrode of the third capacitor is connected to the first voltage terminal to receive the first voltage.

For example, the shift register unit provided by an embodiment of the present disclosure further includes a second control maintaining circuit, and the second control maintaining circuit is configured to perform noise reduction on the output terminal under control of the level of the first control node.

For example, in the shift register unit provided by an embodiment of the present disclosure, the second control maintaining circuit includes a ninth transistor and a fourth capacitor. A gate electrode of the ninth transistor is connected to the first control node, a first electrode of the ninth transistor is connected to a second voltage terminal to receive a second voltage, and a second electrode of the ninth transistor is connected to the output terminal; and a first electrode of the fourth capacitor is connected to a second clock signal terminal to receive a second clock signal, and a second electrode of the fourth capacitor is connected to the first control node.

For example, in the shift register unit provided by an embodiment of the present disclosure, the second control maintaining circuit includes a ninth transistor and a fourth capacitor. A gate electrode of the ninth transistor is connected to the first control node, a first electrode of the ninth transistor is connected to a second voltage terminal to receive a second voltage, and a second electrode of the ninth transistor is connected to the output terminal; and a first electrode of the fourth capacitor is connected to the first control node, and a second electrode of the fourth capacitor is connected to the output terminal.

At least one embodiment of the present disclosure further provides a gate driving circuit, including a plurality of cascaded shift register units provided by any one of the embodiments of the present disclosure; and an input terminal of each of the shift register units except for a first shift register unit is connected to an output terminal of a previous shift register unit.

At least one embodiment of the present disclosure further provides a display device, including the gate driving circuit provided by any one of the embodiments of the present disclosure.

At least one embodiment of the present disclosure further provides a driving method for driving the shift register unit provided by any one of the embodiments of the present disclosure, including: in a first phase, performing first control on the first control node according to the input signal and in response to the first clock signal by the input circuit, performing the first control on the first node under control of the level of the first control node and the first clock signal by the first control circuit, and outputting a first level by the output terminal; in a second phase, performing second control, different from the first control, on the first node, by the first control circuit, under control of the level of the first control node and the first clock signal, and outputting the first voltage by the output terminal; and in a third phase, performing the second control on the first control node according to the input signal and in response to the first clock signal by the input circuit, performing the first control on the first node under control of the level of the first control node and the first clock signal by the first control circuit, and outputting the first level by the output terminal, the first level is lower than the first voltage.

For example, in the driving method provided by an embodiment of the present disclosure, in a case where the shift register unit includes a second control maintaining circuit, the third phase of the driving method further includes: performing noise reduction on the output terminal under control of the level of the first control node by the second control maintaining circuit.

BRIEF DESCRIPTION OF THE DRAWINGS

In order to clearly illustrate the technical solution of the embodiments of the present disclosure, the drawings of the embodiments will be briefly described in the following. It is obvious that the described drawings in the following are only related to some embodiments of the present disclosure and thus are not limitative of the present disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", "coupled", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

A plurality of cascaded low temperature polysilicon (LTPS) shift register units, which are integrated on the display panel, can usually implement a high-level pulse or low-level pulse shift output function. For example, a plurality of cascaded shift register units including N-type transistors can implement shift output of high-level pulse signals, and a plurality of cascaded shift register units including P-type transistors can implement shift output of low-level pulse signals.

Figure 1A:
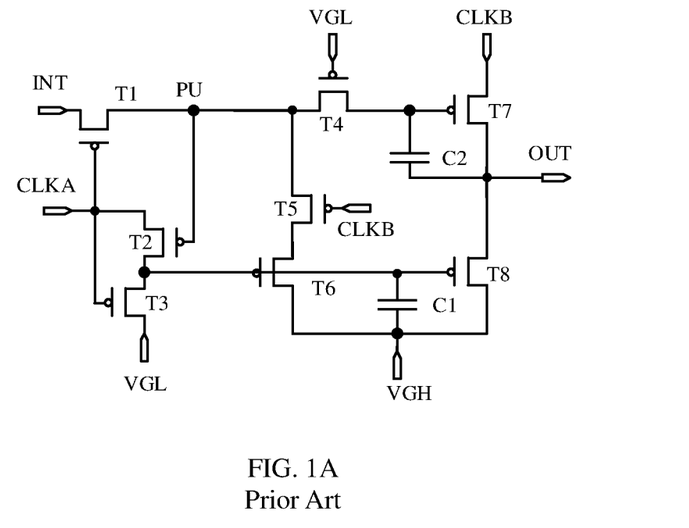
FIG. 1A is a schematic diagram of a shift register unit.
Figure 1B:
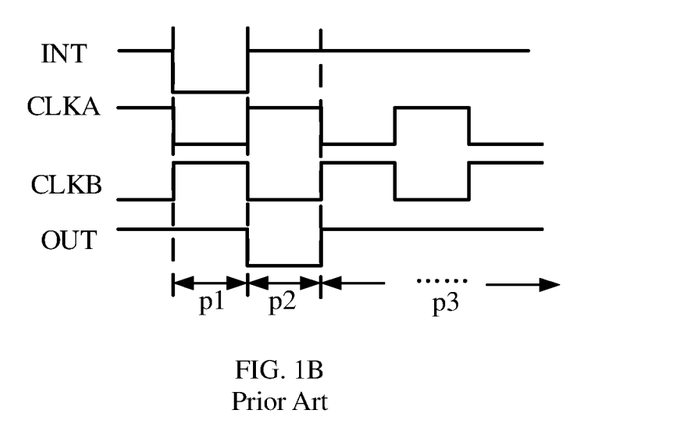
FIG. 1B is a signal timing diagram of the shift register unit illustrated in FIG. 1A in operation.

FIG. 1A is a schematic diagram of a shift register unit. As illustrated in FIG. 1A, transistors included in the shift register unit are all P-type transistors, which can implement output of low-level pulse signals. FIG. 1B is a signal timing diagram of the shift register unit illustrated in FIG. 1A in operation. As illustrated in FIG. 1B, the operation process of the shift register unit includes three phases: a first phase p1, a second phase p2, and a third phase p3. In the following, the three phases are briefly described with reference to FIG. 1A and FIG. 1B.

In the first phase p1 (i.e., an input phase), a first clock signal terminal CLKA provides a low-level signal, a second clock signal terminal CLKB provides a high-level signal, an input terminal INT provides a low-level signal, and a first transistor T1 is turned on in response to the low-level signal provided by the first clock signal terminal CLKA, so that a first control node PU is electrically connected to the input terminal INT, thereby discharging the first control node PU. A seventh transistor T7 is turned on under control of a level of the first control node PU to allow the second clock signal terminal CLKB to be electrically connected to an output terminal OUT, so that in this phase, the output terminal OUT outputs the high-level signal provided by the second clock signal terminal CLKB.

In the second phase p2 (i.e., an output phase), the first clock signal terminal CLKA provides a high-level signal, the second clock signal terminal CLKB provides a low-level signal, and the input terminal INT provides a high-level signal. In this phase, the seventh transistor T7 is turned on under control of the level of the first control node PU, so that the second clock signal terminal CLKB is electrically connected to the output terminal OUT, so that the output terminal OUT outputs the low-level signal provided by the second clock signal terminal CLKB.

In the third phase p3, the input terminal INT provides a high level, the first clock signal provided by the first clock signal terminal CLKA allows the third transistor T3 to be turned on every half cycle, and a low level provided by a first voltage terminal VGL is written into a first capacitor C1 through a third transistor T3, so that a sixth transistor T6 and an eighth transistor T8 are in a turn-on state. Because the sixth transistor T6 is in a turn-on state, and in a case where the low level provided by the second clock signal terminal CLKB allows the fifth transistor T5 to be turned on, the first control node PU is connected to a second voltage terminal VGH, thereby charging the first control node PU by a high level provided by the second voltage terminal VGH, the seventh transistor T7 is turned off under control of the high level of the first control node PU. Simultaneously, because the eighth transistor T8 is in a turn-on state all the time to allow the output terminal OUT to be electrically connected to the second voltage terminal VGH all the time, and the output terminal OUT keeps outputting a high level in this phase.

Organic light-emitting diode (OLED) display panels may use a P-type transistor (e.g., a low-temperature polysilicon P-type transistor) process to implement a construction of a driving circuit (e.g., a gate driving circuit for driving pixel circuits to emit light) of a display device. For example, the driving circuit includes the shift register unit as illustrated in FIG. 1A, and therefore, the driving circuit including P-type transistors can usually be used to implement a shift output of a low-level pulse. In practical applications, a high-level pulse is often required to, for example, control light-emitting of pixel circuits, and therefore it is necessary to use a plurality of cascaded shift register units including P-type transistors to implement a shift output of the high-level pulse, that is, the shift register unit as illustrated in FIG. 1A needs to output a high-level signal in the second phase p2 and output low-level signals in other phases. However, the difficulty in implementing the above technology is that in a plurality of cascaded shift register units including P-type transistors, an output terminal OUT of a previous shift register unit is connected to, for example, an input terminal INT of a next shift register unit, and because the output terminal OUT of the previous shift register unit outputs a high-level signal and the transistors included in the shift register unit are P-type transistors (turned on in response to a low level), the high-level signal cannot allow an output transistor (for example, the seventh transistor T7 as illustrated in FIG. 1A) in the next shift register unit to be turned on in advance, that is, the output transistor cannot be turned on in advance in the first phase p1, so that the plurality of cascaded shift register units including P-type transistors cannot implement a shift output of the high-level signal.

An embodiment of the present disclosure provides a shift register unit, including an input circuit, a first control circuit, and an output circuit. The input circuit is connected to a first control node, and is configured to receive an input signal and control a level of the first control node according to the input signal in response to a first clock signal; the first control circuit is connected to the first control node and a first node, and is configured to control a level of the first node under control of the level of the first control node and the first clock signal; and the output circuit is connected to a first voltage terminal, the first node, and an output terminal, and is configured to receive a first voltage of the first voltage terminal and output the first voltage to the output terminal under control of the level of the first node. The embodiments of the present disclosure further provide a gate driving circuit, a display device, and a driving method, which are corresponding to the above shift register unit.

The shift register unit, the gate driving circuit, the display device, and the driving method provided by the above embodiments of the present disclosure can implement a shift output of a level signal opposite to a turn-on voltage of a transistor. For example, in a case where a plurality of cascaded shift register units are implemented by P-type transistors, a shift output of a high-level signal can be implemented; and in a case where a plurality of cascaded shift register units are implemented by N-type transistors, a shift output of a low-level signal can be implemented.

The embodiments of the present disclosure and examples thereof will be described in detail below with reference to the accompanying drawings.

Figure 2:
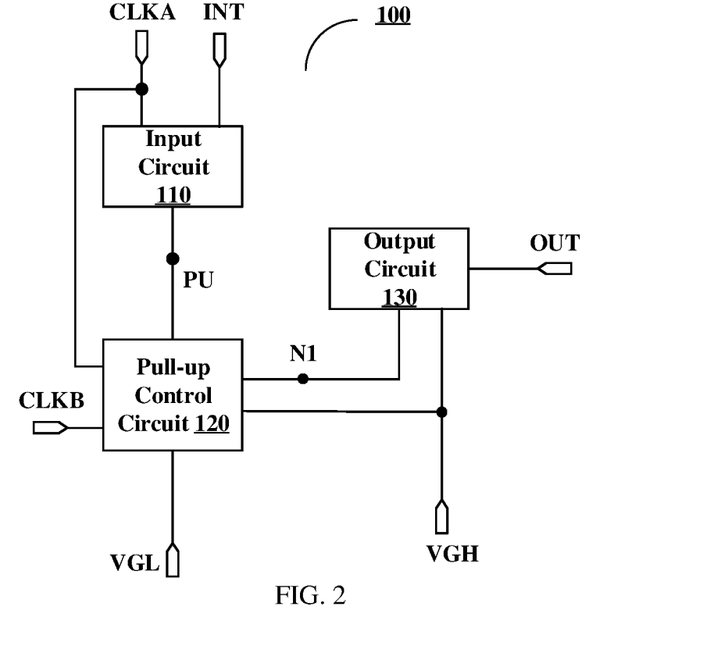
FIG. 2 is a schematic diagram of a shift register unit provided by at least one embodiment of the present disclosure.

FIG. 2 is a schematic diagram of a shift register unit provided by at least one embodiment of the present disclosure. As illustrated in FIG. 2, the shift register unit 100 includes an input circuit 110, a first control circuit (not shown in the figure), and an output circuit 130. For example, a pull-up control circuit 120 as illustrated in FIG. 2 is an example of the first control circuit, and a pull-up node PU is an example of the first control node. In the following, the embodiments of the present disclosure are described by taking a case that the first control circuit is the pull-up control circuit 120 and the first control node is the pull-up node PU as an example, and the embodiments of the present disclosure are not limited to this case. It should be noted that, in the embodiments of the present disclosure, a charging operation is an example of first control, and a discharging operation is an example of second control. In the following, the embodiments of the present disclosure are described by taking a case that the first control is the charging operation and the second control is the discharging operation as an example, and the embodiments of the present disclosure are not limited in this aspect.

The input circuit 110 is configured to receive an input signal and control a level of the pull-up node PU according to the input signal in response to a first clock signal. For example, the input circuit 110 is connected to an input terminal INT, the pull-up node PU, and a first clock signal terminal CLKA, and is configured to electrically connect the pull-up node PU to the input terminal INT to receive the input signal under control of the first clock signal provided by the first clock signal terminal CLKA, so that the input signal input by the input terminal INT can control the level of the pull-up node PU. For example, in a case where the input signal is at a second level (for example, a high level), the pull-up node PU can be charged, and in a case where the input signal is at a first level (for example, a low level), the pull-up node PU can be discharged, thereby controlling the level of the pull-up node PU.

The pull-up control circuit 120 is configured to control a level of a first node N1 under control of the level of the pull-up node PU, the first clock signal, and a second clock signal. For example, the pull-up control circuit 120 is configured to be connected to the first clock signal terminal CLKA, a second clock signal terminal CLKB, the pull-up node PU, the first node N1, a first voltage terminal VGH, and a second voltage terminal VGL, so that the first node N1 is electrically connected to the first voltage terminal VGH or the second clock signal terminal CLKB under control of the level of the pull-up node PU and the first clock signal to allow a voltage of the first node N1 to be increased or decreased, thereby controlling whether the output circuit 130 is turned on.

The output circuit 130 is configured to receive a first voltage of the first voltage terminal VGH and output the first voltage to an output terminal OUT under control of the level of the first node N1, and the first voltage serves as an output signal of the shift register unit 100 to drive, for example, the gate line connected to the output terminal OUT. For example, the output circuit 130 is connected to the first voltage terminal VGH, the first node N1, and the output terminal OUT, and is configured to be turned on under control of the level of the first node N1, so that the first voltage terminal VGH is electrically connected to the output terminal OUT, so that the first voltage provided by the first voltage terminal VGH can be output to the output terminal OUT.

Figure 3:
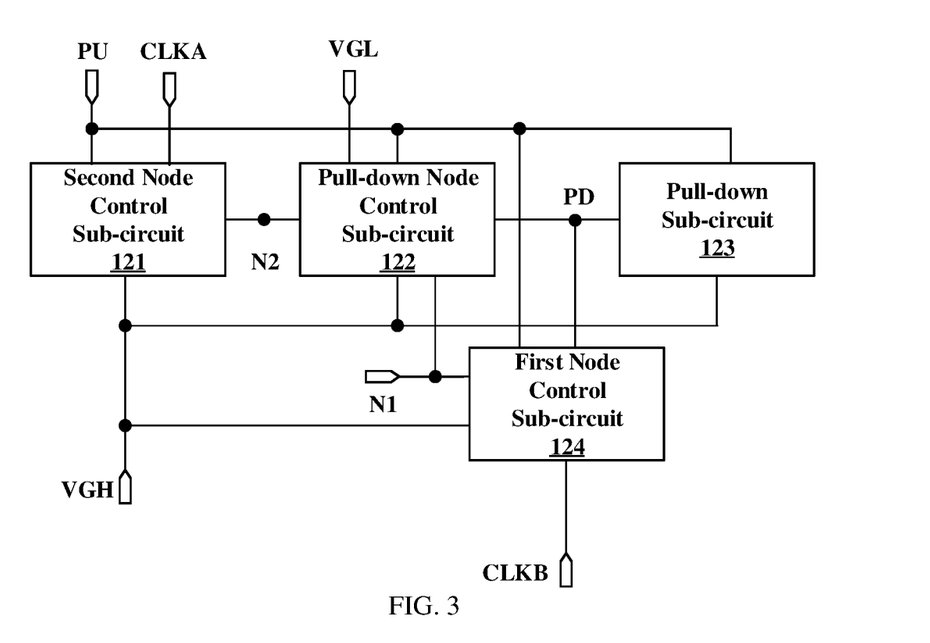
FIG. 3 is a schematic diagram of a first control circuit illustrated in FIG. 2.

FIG. 3 is a schematic diagram of an example of the pull-up control circuit 120 of the shift register unit as illustrated in FIG. 2. As illustrated in FIG. 2, in some examples, the pull-up control circuit 120 includes a second node control sub-circuit 121, a second control node control sub-circuit, a second control sub-circuit, and a first node control sub-circuit 124. It should be noted that, for example, a pull-down node PD is an example of a second control node, a pull-down node control sub-circuit 122 is an example of the second control node control sub-circuit, and a pull-down sub-circuit 123 is an example of the second control sub-circuit. In the following, the embodiments of the present disclosure are described by taking a case that the second control node is the pull-down node PD, the second control node control sub-circuit is the pull-down node control sub-circuit 122, and the second control sub-circuit is the pull-down sub-circuit 123 as an example, and the embodiments of the present disclosure are not limited in this aspect.

The second node control sub-circuit 121 is configured to control a level of the second node N2 under control of the level of the pull-up node PU and the first clock signal. For example, the second node control sub-circuit 121 is connected to the pull-up node PU, the first clock signal terminal CLKA, the first voltage terminal VGH, and the second node N2, and is configured to connect the second node N2 to the first voltage terminal VGH under control of the level of the pull-up node PU, so that the high-level signal (i.e., the first voltage) provided by the first voltage terminal VGH can charge the second node N2. The second node control sub-circuit 121 is further configured to charge or discharge the second node N2 under control of the first clock signal provided by the first clock signal terminal CLKA, so that the pull-down node control sub-circuit 122 is turned off in a case where the second node N2 is at a high level and the pull-down node control sub-circuit 122 is turned on in a case where the second node N2 is at a low level.

The pull-down node control sub-circuit 122 is configured to control a level of the pull-down node PD under control of the level of the pull-up node PU and the level of the second node N2. For example, the pull-down node control sub-circuit 122 is connected to the pull-up node PU, the first voltage terminal VGH, the second voltage terminal VGL, the first node N1, the second node N2, and the pull-down node PD, and is configured to connect the pull-down node PD to the first voltage terminal VGH under control of the level of the pull-up node PU, so that the high-level signal (i.e., the first voltage) provided by the first voltage terminal VGH can charge the pull-down node PD. The pull-down node control sub-circuit 122 is further configured to connect the pull-down node PD to the second voltage terminal VGL under control of the level of the second node N2, thereby discharging the pull-down node PD.

The pull-down sub-circuit 123 is configured to control the level of the pull-up node PU under control of the level of the pull-down node PD. For example, the pull-down sub-circuit 123 can be connected to the pull-down node PD and the first voltage terminal VGH, and is configured to electrically connect the pull-up node PU to the first voltage terminal VGH under control of the level of the pull-down node PD, so that the high-level signal (i.e., the first voltage) provided by the first voltage terminal VGH can charge the pull-up node PU to allow the pull-up node PU to be kept at a high level.

The first node control sub-circuit 124 is configured to control the level of the first node N1 under control of the level of the pull-up node PU and the level of the pull-down node PD. For example, the first node control sub-circuit 124 is connected to the pull-up node PU, the pull-down node PD, the first voltage terminal VGH, the second clock signal terminal CLKB, and the first node N1, and is configured to electrically connect the first node N1 to the first voltage terminal VGH under control of the level of the pull-up node PU, so that the first node N1 can be charged. The first node control sub-circuit 124 is further configured to connect the first node N1 to the second clock signal terminal CLKB under control of the level of the pull-down node PD, so that the first node N1 can be charged or discharged.

Figure 4:
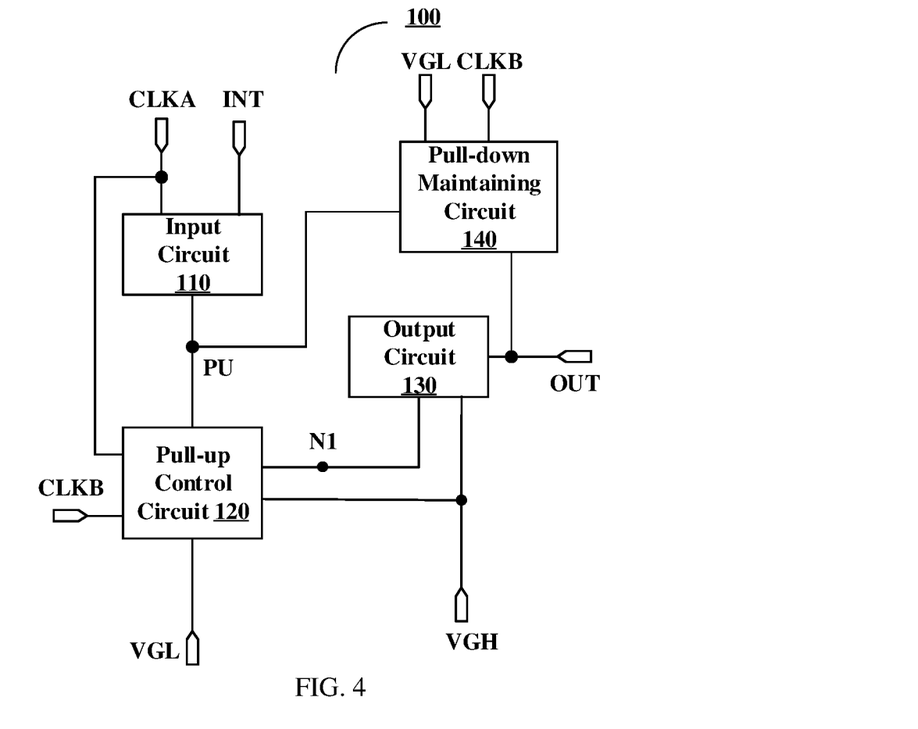
FIG. 4 is a schematic diagram of another shift register unit provided by at least one embodiment of the present disclosure.

For example, in some examples, the shift register unit 100 may further include a second control maintaining circuit. FIG. 4 is a schematic diagram of another shift register unit provided by at least one embodiment of the present disclosure. For example, the pull-down maintaining circuit 140 as illustrated in FIG. 4 is an example of the second control maintaining circuit. In the following, the embodiments of the present disclosure are described by taking a case that the second control maintaining circuit is the pull-down maintaining circuit 140 as an example, and the embodiments of the present disclosure are not limited in this aspect. As illustrated in FIG. 4, on the basis of the example as illustrated in FIG. 2, the shift register unit 100 may further include the pull-down maintaining circuit 140, and other structures of the shift register unit 100 are similar to those of the shift register unit 100 as illustrated in FIG. 2, which are not described herein again.

The pull-down maintaining circuit 140 is configured to perform noise reduction on the output terminal OUT under control of the level of the pull-up node PU. For example, the pull-down maintaining circuit 140 is connected to the second voltage terminal VGL, the second clock signal terminal CLKB, the pull-up node PU, and the output terminal OUT, so that the output terminal OUT is electrically connected to the second voltage terminal VGL under control of the level of the pull-up node PU, thereby performing noise reduction on the output terminal OUT.

It should be noted that, the first voltage terminal VGH, for example, can be configured to keep inputting a DC high-level signal, and for example, the DC high-level signal is referred to as the first voltage; and the second voltage terminal VGL, for example, can be configured to keep inputting a DC low-level signal, for example, the DC low-level signal is referred to as the second voltage, and the second voltage is lower than the first voltage. This case can be applied to the following embodiments, and details will not be described again. For example, the first level may be the same as or different from the second voltage, and may be lower than the first voltage.

Figure 5A:
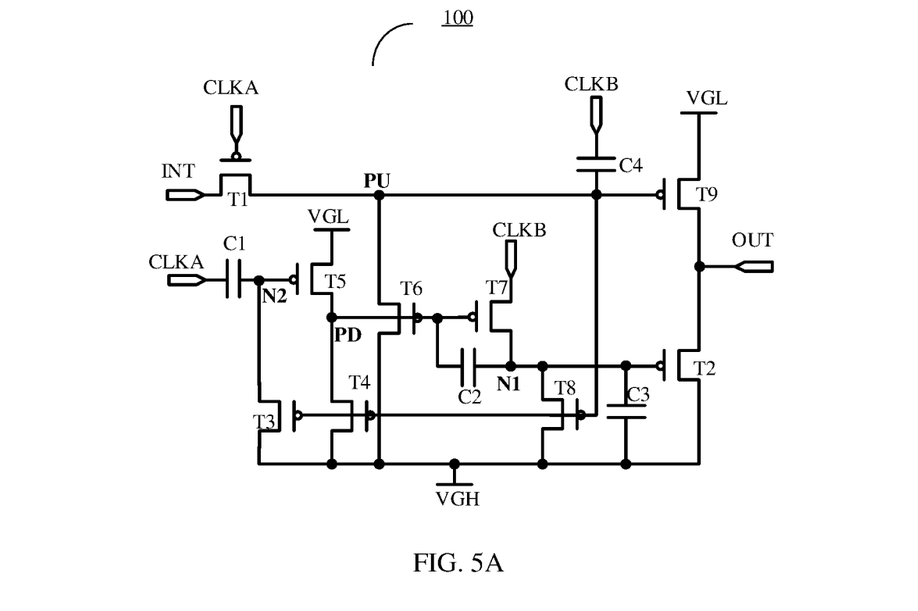
FIG. 5A is a circuit schematic diagram of a specific implementation example of the shift register unit illustrated in FIG. 4.

For example, the shift register unit 100 as illustrated in FIG. 4 may be specifically implemented as a circuit structure as illustrated in FIG. 5A in an example. The following description is described by taking a case that respective transistors are P-type transistors as an example, but the embodiments of the present disclosure are not limited to this case. For example, a P-type transistor is turned on in response to a low-level signal and is turned off in response to a high-level signal. This case may be applied to the following embodiments, and details will not be described again. As illustrated in FIG. 5A, the shift register unit 100 includes transistors T1 to T9 and further includes capacitors C1 to C4.

The input circuit 110 may be implemented as a first transistor T1. A gate electrode of the first transistor T1 is connected to the first clock signal terminal CLKA to receive the first clock signal, a first electrode of the first transistor T1 is connected to the input terminal INT to receive the input signal, and a second electrode of the first transistor T1 is connected to the pull-up node PU, so that in a case where the first transistor T1 is turned on by a turn-on signal (a low-level signal) received by the first clock signal terminal CLKA, the input signal provided by the input signal terminal INT is used to control the level of the pull-up node PU.

The output circuit 130 may be implemented as a second transistor T2. A gate electrode of the second transistor T2 is connected to the first node N1, a first electrode of the second transistor T2 is connected to the first voltage terminal VGH to receive the first voltage, and a second electrode of the second transistor T2 is connected to the output terminal OUT.

The second node control sub-circuit 121 may be implemented as a third transistor T3 and a first capacitor C1. A gate electrode of the third transistor T3 is connected to the pull-up node PU, a first electrode of the third transistor T3 is connected to the first voltage terminal VGH to receive the first voltage, and a second electrode of the third transistor T3 is connected to the second node N2. A first electrode of the first capacitor C1 is connected to the first clock signal terminal CLKA to receive the first clock signal, and a second electrode of the first capacitor C1 is connected to the second node N2. Therefore, the second node N2 is kept at a high level (for example, the first voltage provided by the first voltage terminal VGH) in a case where the third transistor T3 is turned on, and in a case where the third transistor T3 is turned off, because of a coupling effect of the first capacitor C1, the second node N2 is kept at a low level in a case where the first clock signal provided by the first clock signal terminal CLKA is at a low level, and the second node N2 is kept at a high level in a case where the first clock signal provided by the first clock signal terminal CLKA is at a high level.

The pull-down node control sub-circuit 122 may be implemented as a fourth transistor T4, a fifth transistor T5, and a second capacitor C2. A gate electrode of the fourth transistor T4 is connected to the pull-up node PU, a first electrode of the fourth transistor T4 is connected to the first voltage terminal VGH to receive the first voltage, and a second electrode of the fourth transistor T4 is connected to the pull-down node PD. A gate electrode of the fifth transistor T5 is connected to the second node N2, a first electrode of the fifth transistor T5 is connected to the second voltage terminal VGL to receive the second voltage, and a second electrode of the fifth transistor T5 is connected to the pull-down node PD. A first electrode of the second capacitor C2 is connected to the pull-down node PD, and the second electrode of the second capacitor C2 is connected to the first node N1. Therefore, the pull-down node PD is kept at a high level (for example, the first voltage provided by the first voltage terminal VGH) in a case where the fourth transistor T4 is turned on, and in a case where the fourth transistor T4 is turned off, the fifth transistor T5 is turned on under control of the level of the second node N2, so that the pull-down node PD is electrically connected to the second voltage terminal VGL, thereby discharging the pull-down node PD.

The pull-down sub-circuit 123 may be implemented as a sixth transistor T6. A gate electrode of the sixth transistor T6 is connected to the pull-down node PD, a first electrode of the sixth transistor T6 is connected to the first voltage terminal VGH to receive the first voltage, and a second electrode of the sixth transistor T6 is connected to the pull-up node PU. The sixth transistor T6 is turned on in a case where the pull-down node PD is at a low level, and connects the pull-up node PU to the first voltage terminal VGH, so that the high level of the pull-up node PU can be maintained and cannot be reduced by the second clock signal or leakage of other transistors, thereby ensuring the reliability of the circuit.

The first node control sub-circuit 124 may be implemented as a seventh transistor T7, an eighth transistor T8, and a third capacitor C3. A gate electrode of the seventh transistor T7 is connected to the pull-down node PD, a first electrode of the seventh transistor T7 is connected to the second clock signal terminal CLKB to receive the second clock signal, and a second electrode of the seventh transistor T7 is connected to the first node N1. A gate electrode of the eighth transistor T8 is connected to the pull-up node PU, a first electrode of the eighth transistor T8 is connected to the first voltage terminal VGH to receive the first voltage, and a second electrode of the eighth transistor T8 is connected to the first node N1. A first electrode of the third capacitor C3 is connected to the first node N1, and a second electrode of the third capacitor C3 is connected to the first voltage terminal VGH to receive the first voltage. The seventh transistor T7 is turned on in a case where the pull-down node PD is at a low level, and the seventh transistor T7 connects the first node N1 to the second clock signal terminal CLKB, so that the first node N1 is kept at a low level in a case where the second clock signal provided by the second clock signal terminal CLKB is at a low level, so that the ninth transistor T9 is turned on under control of the level of the first node N1 and connects the output terminal OUT to the first voltage terminal VGH, so that the output terminal OUT outputs a high level at an output phase. The eighth transistor T8 is turned on in a case where the pull-up node PU is at a low level and connects the first node N1 to the first voltage terminal VGH, so that the first node N1 is kept at a high level, and the ninth transistor T9 is turned off, thereby ensuring that the output terminal OUT outputs a low level in an non-output phase.

For example, in the example as illustrated in FIG. 5A, the pull-down maintaining circuit 140 may be implemented as a ninth transistor T9 and a fourth capacitor C4. A gate electrode of the ninth transistor T9 is connected to the pull-up node PU, a first electrode of the ninth transistor T9 is connected to the second voltage terminal VGL to receive the second voltage, and a second electrode of the ninth transistor T9 is connected to the output terminal OUT. A first electrode of the fourth capacitor C4 is connected to the second clock signal terminal CLKB to receive the second clock signal, and a second electrode of the fourth capacitor C4 is connected to the pull-up node PU. The ninth transistor T9 is turned on under control of the pull-up node PU and electrically connects the output terminal OUT to the second voltage terminal VGL, thereby performing noise reduction on the output terminal OUT.

Figure 5B:
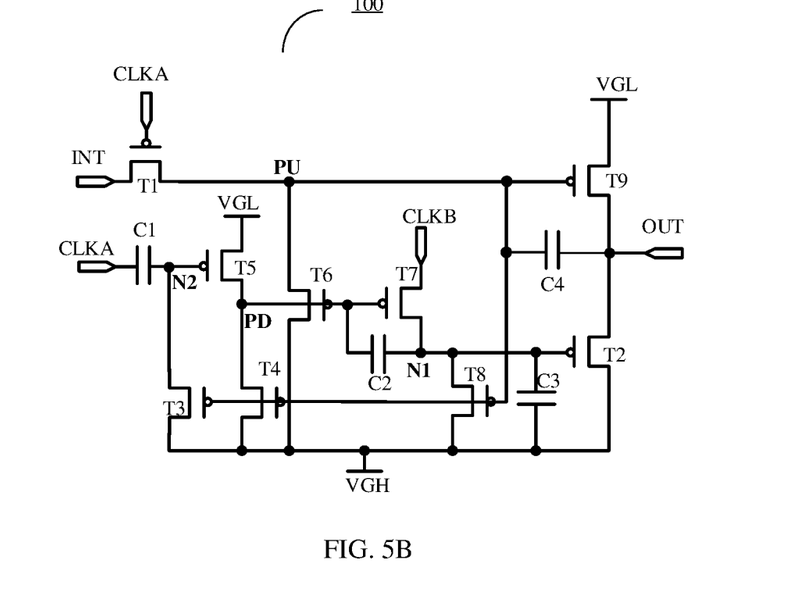
FIG. 5B is a circuit schematic diagram of another specific implementation example of the shift register unit illustrated in FIG. 4.

FIG. 5B is a circuit schematic diagram of another specific implementation example of the shift register unit as illustrated in FIG. 4. As illustrated in FIG. 5B, the structure of the shift register unit 100 is similar to the structure of the shift register unit 100 as illustrated in FIG. 5A. The pull-down maintaining circuit 140 may be implemented as a ninth transistor T9 and a fourth capacitor C4, a gate electrode of the ninth transistor T9 is connected to the pull-up node PU, a first electrode of the ninth transistor T9 is connected to the second voltage terminal VGL to receive the second voltage, and a second electrode of the ninth transistor T9 is connected to the output terminal OUT. The difference between the pull-down maintaining circuit as illustrated in FIG. 5B and the pull-down maintaining circuit as illustrated in FIG. 5A is that a first electrode of the fourth capacitor C4 is connected to the pull-up node PU, and a second electrode of the fourth capacitor C4 is connected to the output terminal OUT.

It should be noted that all the transistors used in the embodiments of the present disclosure may be thin film transistors, field effect transistors, or other switching components with the same characteristics. In the embodiments of the present disclosure, the thin film transistors are taken as examples for description. A source electrode and drain electrode of a transistor used herein may be symmetrical in structure, so there can be no difference in structure of the source electrode and drain electrode of the transistor. In the embodiments of the present disclosure, in order to distinguish the two electrodes, except for a gate electrode of the transistor, of the transistor, one electrode is directly described as the first electrode, and the other electrode is directly described as the second electrode.

In addition, the embodiments of the present disclosure are described by taking a case that the transistor is the P-type transistor as an example. Simultaneously, a first electrode of the transistor is a source electrode, and a second electrode of the transistor is a drain electrode. The P-type transistor is turned on in response to a low level and is turned off in response to a high level. This case may be applied to the following embodiments, and details will not be described again. It should be noted that the present disclosure includes but is not limited thereto. For example, one or more transistors in the shift register unit provided by the embodiments of the present disclosure may also use the N-type transistor. In this case, the first electrode of the transistor is a drain electrode, and the second electrode of the transistor is a source electrode. Polarities of respective electrodes of selected type of transistors can be connected according to polarities of respective electrodes of respective transistors in the embodiments of the present disclosure.

It should be noted that in the embodiments of the present disclosure, for example, in a case where each circuit is implemented as a P-type transistor, the term "pull-up" represents discharging a node or an electrode of a transistor to decrease an absolute value of a level of the node or the electrode, thereby implementing the corresponding operation (for example, turn-on) of the transistor; and the term "pull-down" represents charging a node or an electrode of a transistor to increase an absolute value of a level of the node or the electrode, thereby implementing the corresponding operation (for example, turn-off) of the transistor.

As another example, in a case where each circuit is implemented as an N-type transistor, the term "pull-up" represents charging a node or an electrode of a transistor to increase an absolute value of a level of the node or the electrode, thereby implementing the corresponding operation (for example, turn-on) of the transistor; and the term "pull-down" represents discharging a node or an electrode of a transistor to decrease an absolute value of a level of the node or the electrode, thereby implementing the corresponding operation (for example, turn-off) of the transistor.

It should be noted that in the description of respective embodiments of the present disclosure, the pull-up node PU, the pull-down node PD, the first node N1, and the second node N2 do not represent really existing components, but rather represent joining points of related circuit connections in the circuit diagram.

Figure 6A:
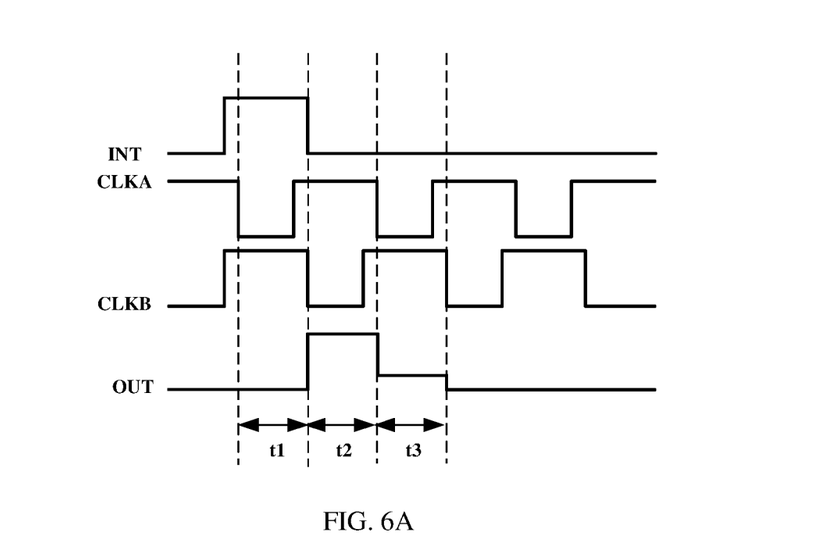
FIG. 6A is a signal timing diagram of the shift register unit illustrated in FIG. 5A in operation.

FIG. 6A is a signal timing diagram of the shift register unit as illustrated in FIG. 5A in operation. The working principle of the shift register unit 100 as illustrated in FIG. 5A is described below with reference to the signal timing diagram as illustrated in FIG. 6A. Here the embodiments of the present disclosure are described by taking a case that each transistor is a P-type transistor as an example, but the embodiments of the present disclosure are not limited in this aspect. The shift register unit 100 can perform the following operations in three phases, which includes a first phase t1, a second phase t2, and a third phase t3, respectively, as illustrated in FIG. 6A.

In the first phase t1 (i.e., an input phase), the input terminal INT provides a high-level signal, the first clock signal terminal CLKA provides a low-level first clock signal, the second clock signal terminal CLKB provides a high-level second clock signal, and the first transistor T1 is turned on in response to the low-level first clock signal provided by the first clock signal terminal CLKA, so that the pull-up node PU is connected to the input terminal INT, so that the pull-up node PU is charged to a high level. The third transistor T3, the fourth transistor T4 and the eighth transistor T8 are turned off under control of the high level of the pull-up node PU.

In this first phase, at the moment where the first clock signal terminal CLKA becomes at a low level, because of the coupling effect of the first capacitor C1, the level of the second node N2 becomes at a low level, and the fifth transistor T5 is turned on in response to the low level of the second node N2 and connects the pull-down node PD to the second voltage terminal VGL, so that the pull-down node PD is discharged to a low level, and a low level is stored in the second capacitor C2.

In this first phase, the sixth transistor T6 is turned on in response to the low level of the pull-down node PD to connect the pull-up node PU to the first voltage terminal VGH, so that the voltage of the pull-up node PU is maintained at a high level to ensure that the third transistor T3, the fourth transistor T4, and the eighth transistor T8 are in a turn-off state. Simultaneously, the seventh transistor T7 is also turned on in response to the low level of the pull-down node PD to connect the first node N1 to the second clock signal terminal CLKB, so that the high level provided by the second clock signal terminal CLKB is written into the third capacitor C3 to allow the level of the first node N1 to be kept at a high level. The second transistor T2 is turned off in response to the high level of the first node N1, so that the output terminal OUT outputs a low level in this phase.

In the second phase t2 (i.e., the output phase), the input terminal INT provides a low-level signal, the first clock signal terminal CLKA provides a high-level first clock signal, the second clock signal terminal CLKB provides a low-level second clock signal, the first transistor T1 is turned off under control of the high-level first clock signal provided by the first clock signal terminal CLKA, and the pull-up node PU is maintained at a high-level state. Therefore, in this phase, the third transistor T3, the fourth transistor T4, and the eighth transistor T8 are still turned off under control of the high level of the pull-up node PU.

In this second phase, the first clock signal terminal CLKA provides a high-level signal in this phase. Because of the coupling effect of the first capacitor C1, the second node N2 is charged to a high level, the fifth transistor T5 is turned off under control of the high level of the second node N2, and electric charges stored in the second capacitor C2 do not change, so that the level of the pull-down node PD is still maintained in a low-level state. Therefore, the sixth transistor T6 is still turned on in response to the low level of the pull-down node PD to connect the pull-up node PU to the first voltage terminal VGH, so that the voltage of the pull-up node PU may not be reduced because of the decrease of the second clock signal provided by the second clock signal terminal CLKB connected to the fourth capacitor C4, thereby ensuring that the third transistor T3, the fourth transistor T4, and the eighth transistor T8 are maintained in a turn-off state.

In this second phase, the seventh transistor T7 is still turned on in response to the low level of the pull-down node PD, so that the first node N1 is connected to the second clock signal terminal CLKB. Because the second clock signal terminal CLKB provides a low-level second clock signal, the first node N1 is discharged through the second clock signal terminal CLKB. The second transistor T2 is turned on in response to the low level of the first node N1, so that the output terminal OUT is electrically connected to the first voltage terminal VGH. Therefore, in this phase, the output terminal OUT outputs a first voltage (a high level) for subsequent driving control of, for example, the pixel circuit.

In the third phase t3, the input terminal INT continues to provide a low-level signal, the first clock signal terminal CLKA provides a low-level first clock signal, the second clock signal terminal CLKB provides a high-level second clock signal, and the first transistor T1 is turned on in response to the low-level first clock signal provided by the first clock signal terminal CLKA to connect the pull-up node PU to the input terminal INT, so that the pull-up node PU is discharged to a low level. The third transistor T3, the fourth transistor T4, and the eighth transistor T8 are turned on under control of the low level of the pull-up node PU. Because the third transistor T3 is turned on, the second node N2 is connected to the first voltage terminal VGH, and the second node N2 is no longer subject to the coupling effect of the first capacitor C1, so that the level of the second node N2 is the first voltage (a high level). Because the fourth transistor T4 is turned on, the pull-down node PD is connected to the first voltage terminal VGH, so that the voltage of the pull-down node PD is the first voltage (a high level). Simultaneously, the fifth transistor T5 is turned off under control of the high level of the second node N2.

In this third phase, the sixth transistor T6 is turned off under control of the high level of the pull-down node PD, thereby ensuring that the pull-up node PU is maintained in a low-level state. Simultaneously, the seventh transistor T7 is also turned off under control of the high level of the pull-down node PD, so that the low-level signal provided by the second clock signal terminal CLKB cannot be transmitted to the first node N1 through the seventh transistor T7. Simultaneously, because the eighth transistor T8 is turned on, the first node N1 is connected to the first voltage terminal VGH, so that the first node N1 is charged to the first voltage (a high level). The second transistor T2 is turned off under control of the high level of the first node N1, thereby ensuring that the output terminal OUT outputs a low level in this phase.

In a case where the shift register unit 100 further includes the pull-down maintaining circuit 140 (for example, including the ninth transistor T9 and the fourth capacitor C4), in this third phase, the ninth transistor T9 is turned on in response to the low level of the pull-up node PU, the output terminal OUT to be connected to the second voltage terminal VGL, so that the output terminal OUT outputs a low level to perform noise reduction on the output terminal OUT. Because the ninth transistor T9 has a threshold voltage, the ninth transistor T9 cannot not be completely turned on, so that in this phase, the output terminal OUT may output a slightly higher level than the low level provided by the second voltage terminal VGL, which will not affect driving of the subsequent circuit. In a case where the second clock signal terminal CLKB provides a low-level signal again, the level of the pull-up node PU can reach a lower state by the coupling effect of the fourth capacitor C4, so that the ninth transistor T9 is completely turned on, so that the level output by the output terminal OUT is exactly identical to the low level provided by the second voltage terminal VGL.

Figure 6B:
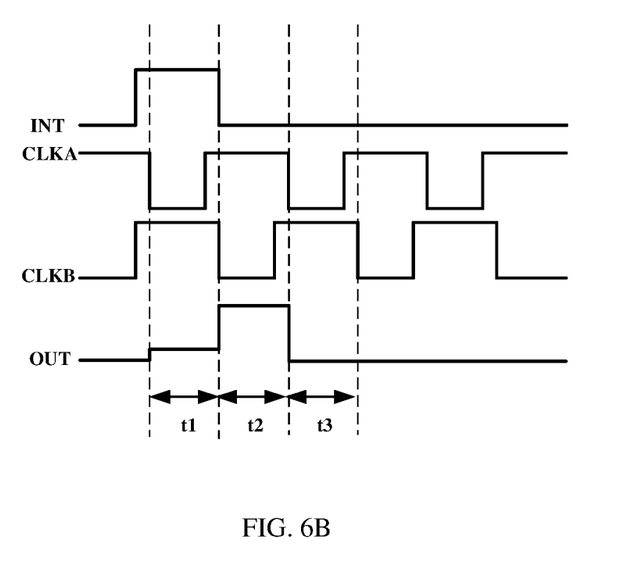
FIG. 6B is a signal timing diagram of the shift register unit illustrated in FIG. 5B in operation.

FIG. 6B is a signal timing diagram of the shift register unit as illustrated in FIG. 5B in operation. The working principle of the shift register unit as illustrated in FIG. 5B is similar to the working principle of the shift register unit as illustrated in FIG. 5A, and the difference is as follows. In the first phase t1, the fourth capacitor C4 is between the pull-up node PU and the output terminal OUT, and because of the coupling effect of the fourth capacitor C4, the pull-up transition of the pull-up node PU is transmitted to the output terminal OUT through the fourth capacitor C4, so that the level output by the output terminal OUT may have a small level rise phenomenon, which will not affect the use of the circuit. In the third phase t3, because in this example, the fourth capacitor C4 is between the pull-up node PU and the output terminal OUT, in a case where the ninth transistor T9 is turned on, the level of the pull-up node PU may be far lower than the level of the second voltage terminal VGL by the bootstrap effect of the fourth capacitor C4, so that the ninth transistor T9 can be completely turned on under control of the level of the pull-up node PU, so that the level output by the output terminal OUT in the third phase to be completely equal to the low level provided by the second voltage terminal VGL without generating the level rise phenomenon as illustrated in FIG. 6A.

Figure 7:
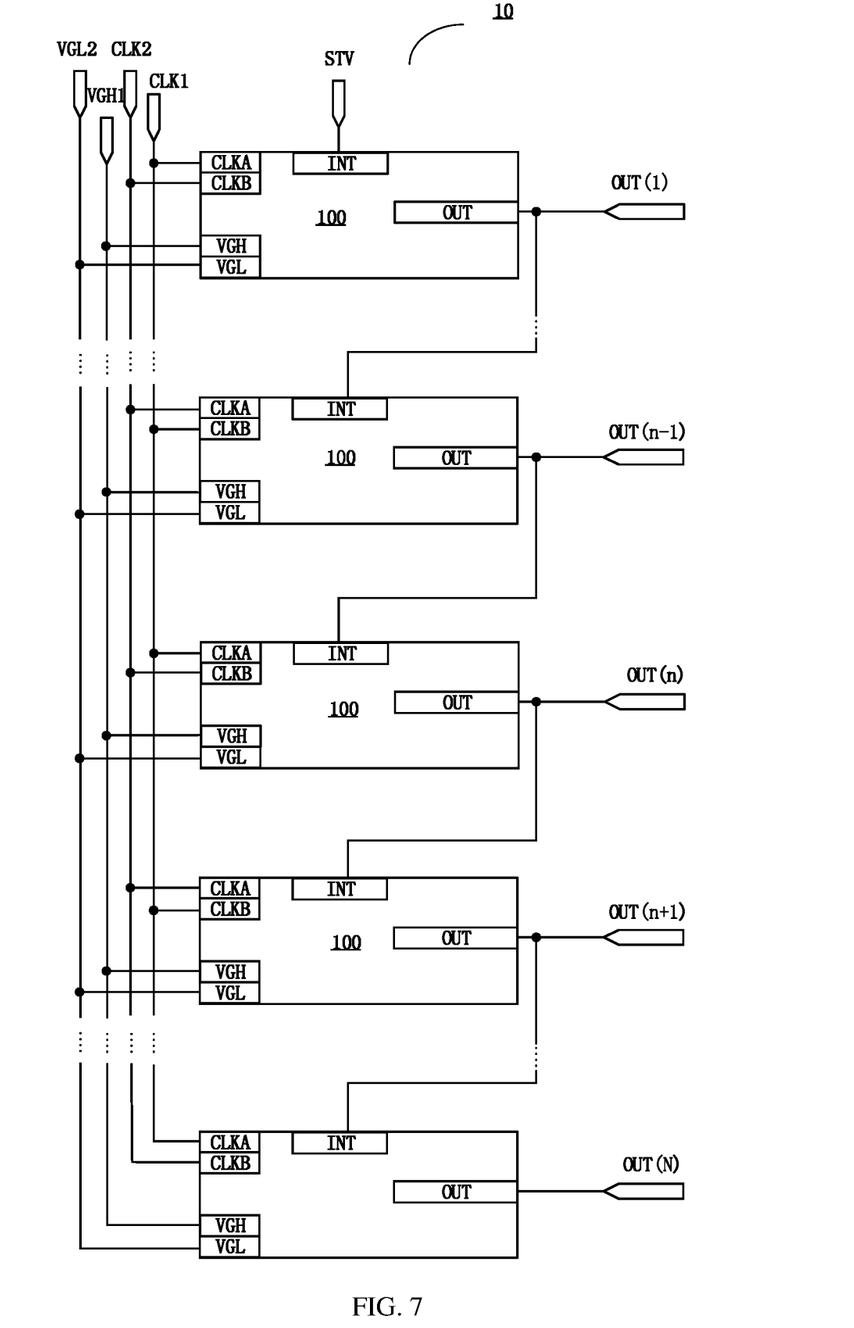
FIG. 7 is a schematic diagram of a gate driving circuit provided by at least one embodiment of the present disclosure.

At least one embodiment of the present disclosure further provides a gate driving circuit. For example, as illustrated in FIG. 7, the gate driving circuit 10 includes a first clock signal line CLK1, a second clock signal line CLK2, a first voltage line VGH1, a second voltage line VGL2, and a plurality of cascaded shift register units 100. The shift register unit may use the shift register unit 100 described in any one of the embodiments of the present disclosure. For example, here each shift register unit 100 may use the circuit structure as illustrated in FIG. 5A or FIG. 5B, but the embodiments of the present disclosure are not limited thereto. The gate driving circuit 10 can be directly integrated on the array substrate of the display device by using the same manufacturing process as the thin film transistor to implement the progressively scanning and driving function.

For example, as illustrated in FIG. 7, each of the shift register units further includes a first clock signal terminal CLKA and a second clock signal terminal CLKB, and the first clock signal terminal CLKA and the second clock signal terminal CLKB are configured to be connected to the first clock signal line CLK1 or the second clock signal line CLK2 to receive the first clock signal or the second clock signal. The first clock signal line CLK1 is connected to a first clock signal terminal CLKA of a (2m−1)th (m is an integer greater than 0) shift register unit and a second clock signal terminal CLKB of a (2m)th shift register unit, and the second clock signal line CLK2 is connected to a first clock signal terminal CLKA of the (2m)th shift register unit and a second clock signal terminal CLKB of the (2m−1)th shift register unit. It should be noted that the embodiments of the present disclosure include, but are not limited to the above connecting manners. For example, the first clock signal line CLK1 may be connected to the first clock signal terminal CLKA of the (2m)th shift register unit and the second clock signal terminal CLKB of the (2m−1)th shift register unit, and the second clock signal line CLK2 is connected to the first clock signal terminal CLKA of the (2m−1)th shift register unit and the second clock signal terminal CLKB of the (2m)th shift register unit CLKB. The embodiments of the present disclosure are not limited in this aspect.

For example, as illustrated in FIG. 7, each of the shift register units further includes a first voltage terminal VGH and a second voltage terminal VGL, the first voltage terminal VGH is configured to be connected to the first voltage line VGH1 to receive the first voltage, and the second voltage terminal VGL is configured to be connected to the second voltage line VGL2 to receive the second voltage.

It should be noted that OUT(1) as illustrated in FIG. 7 represents an output terminal of a first shift register unit, OUT(n−1) represents an output terminal of an (n−1)th shift register unit (n is an integer greater than 1), OUT(n) represents an output terminal of an (n)th shift register unit, OUT(n+1) represents an output terminal of an (n+1)th shift register unit, etc. The reference numerals may be applied to the following embodiments, and details will not be described again.

For example, as illustrated in FIG. 7, the gate driving circuit 10 may further include a timing controller (not shown in the figure). For example, the timing controller may be configured to be connected to the first clock signal line CLK1, the second clock signal line CLK2, the first voltage line VGH1, the second voltage line VGL2, and a trigger signal line STV to provide the clock signal, the first voltage signal, the second voltage signal, and a trigger signal for each shift register unit, respectively.

For example, as illustrated in FIG. 7, an input terminal INT of each of the shift register units except for the first shift register unit is connected to an output terminal OUT of a previous shift register unit. For example, an input terminal INT of the first shift register unit may be configured to be connected to the trigger signal line STV to receive the trigger signal.

It should be noted that, according to different configurations, the gate driving circuit 10 may further include four, six, or eight clock signal lines, the number of the clock signal lines depends on specific conditions, and the embodiments of the present disclosure are not limited in this aspect.

It should be noted that in a case where the gate driving circuit 10 provided by the embodiments of the present disclosure is used to drive a display panel, the gate driving circuit 10 may be disposed on one side of the display panel. For example, the display panel includes a plurality of rows of gate lines, and output terminals of respective shift register units in the gate driving circuit 10 may be configured to be sequentially connected to the plurality of rows of gate lines for outputting gate scanning signals. It should be noted that the gate driving circuit 10 may further be provided on both sides of the display panel to implement bilateral driving, and the embodiments of the present disclosure do not limit the manner of setting the gate driving circuit 10. For example, the gate driving circuit 10 may be provided on one side of the display panel for driving odd-numbered rows of gate lines, and another gate driving circuit 10 may be provided on the other side of the display panel for driving even-numbered rows of gate lines.

The gate driving circuit can implement a shift output of a level signal opposite to a turn-on voltage of a transistor. For example, in a case where shift register units included in the gate driving circuit is implemented by a P-type transistor, a shift output of a high-level signal can be implemented; and in a case where shift register units included in the gate driving circuit is implemented by an N-type transistor, a shift output of a low-level signal can be implemented.

Figure 8:
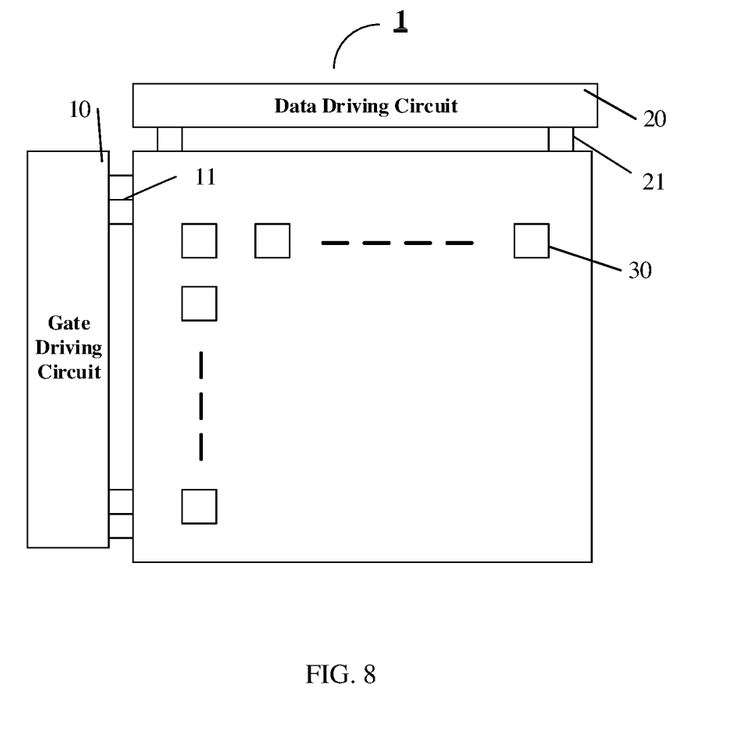
FIG. 8 is a schematic diagram of a display device provided by at least one embodiment of the present disclosure.

The embodiments of the present disclosure further provide a display device 1. As illustrated in FIG. 8, the display device 1 includes the gate driving circuit 10 provided by any one of the embodiments of the present disclosure. The display device 1 includes a pixel array including a plurality of pixel units 30. For example, the display device 1 may further include a data driving circuit 20. The data driving circuit 20 is used to provide data signals to the pixel array, and the gate driving circuit 10 is used to provide gate scanning signals to the pixel array. The data driving circuit 20 is electrically connected to the plurality of pixel units 30 through data lines 21, and the gate driving circuit 10 is electrically connected to the plurality of pixel units 30 through gate lines 11.

It should be noted that the display device 1 in the present embodiments may be any product or component having a display function, such as a liquid crystal panel, a liquid crystal television, a display screen, an OLED panel, an OLED television, an electronic paper display device, a mobile phone, a tablet computer, a notebook computer, a digital photo frame, a navigator, etc. The display device 1 may further include other general components such as a display panel, and the embodiments of the present disclosure are not limited in this aspect.

The technical effects of the display device 1 provided by the embodiments of the present disclosure may be with reference to the corresponding description related to the gate driving circuit 10 in the above embodiments, and details are not described herein again.

It should be noted that, for clarity and conciseness, the entire structure of the display device 1 is not provided. In order to implement the necessary functions of the display device, those skilled in the art may set other structures not shown according to specific application scenarios, and the embodiments of the present disclosure are not limited in this aspect.

An embodiment of the present disclosure further provides a driving method for driving a shift register unit, for example, used for driving a shift register unit of a display device. For example, in the example as illustrated in FIG. 2, the driving method for driving the shift register unit includes the following steps.

In a first phase, the input circuit 110 charges the pull-up node PU according to the input signal and in response to the first clock signal, the pull-up control circuit 120 charges the first node N1 under control of the pull-up node PU and the first clock signal, and the output terminal OUT outputs a first level (for example, lower than the first voltage, such as a low level).

In a second phase, the pull-up control circuit 120 discharges the first node N1 under control of the level of the pull-up node PU and the first clock signal, and the output terminal OUT outputs the first voltage.

In a third phase, the input circuit 110 discharges the pull-up node PU according to the input signal and in response to the first clock signal, the pull-up control circuit 120 charges the first node N1 under control of the level of the pull-up node PU and the first clock signal, and the output terminal OUT outputs a low level.

For example, in the example as illustrated in FIG. 4, that is, in a case where the shift register unit 100 includes the pull-down maintaining circuit 140, the third phase of the driving method for driving the shift register unit 100 further includes the following operation: performing noise reduction on the output terminal OUT under control of the level of the pull-up node PU by the pull-down maintaining circuit 140.

It should be noted that the detailed description and technical effect of the driving method may be with reference to the description of the working principle and technical effect of the shift register unit 100 in the embodiments of the present disclosure, and details are not described herein again.

The following statements should be noted:

(1) The accompanying drawings involve only the structure(s) in connection with the embodiment(s) of the present disclosure, and other structure(s) can be referred to common design(s).

(2) In case of no conflict, features in one embodiment or in different embodiments can be combined to obtain new embodiments.

What have been described above are only specific implementations of the present disclosure, the protection scope of the present disclosure is not limited thereto, and the protection scope of the present disclosure should be based on the protection scope of the claims.

What is claimed is:

1. A shift register unit, comprising: an input circuit, a first control circuit, and an output circuit,
    wherein the input circuit is configured to receive an input signal and control a level of a first control node according to the input signal in response to a first clock signal;
    the first control circuit is configured to control a level of a first node under control of the level of the first control node and the first clock signal; and
    the output circuit is configured to receive a first voltage of a first voltage terminal and output the first voltage to an output terminal under control of the level of the first node;
    wherein the first control circuit comprises a second node control sub-circuit, a second control node control sub-circuit, a second control sub-circuit, and a first node control sub-circuit,
    wherein the second node control sub-circuit is configured to control a level of a second node under control of the level of the first control node and the first clock signal;
    the second control node control sub-circuit is configured to control a level of a second control node under control of the level of the first control node and the level of the second node;
    the second control sub-circuit is configured to control the level of the first control node under control of the level of the second control node; and
    the first node control sub-circuit is configured to control the level of the first node under control of the level of the first control node and the level of the second control node.

2. The shift register unit according to claim 1, wherein the input circuit comprises a first transistor,
    a gate electrode of the first transistor is connected to a first clock signal terminal to receive the first clock signal, a first electrode of the first transistor is connected to an input terminal to receive the input signal, and a second electrode of the first transistor is connected to the first control node.

3. The shift register unit according to claim 1, wherein the output circuit comprises a second transistor,
    a gate electrode of the second transistor is connected to the first node, a first electrode of the second transistor is connected to the first voltage terminal to receive the first voltage, and a second electrode of the second transistor is connected to the output terminal.

4. The shift register unit according to claim 1, wherein the second node control sub-circuit comprises:
    a third transistor, wherein a gate electrode of the third transistor is connected to the first control node, a first electrode of the third transistor is connected to the first voltage terminal to receive the first voltage, and a second electrode of the third transistor is connected to the second node; and a first capacitor, wherein a first electrode of the first capacitor is connected to a first clock signal terminal to receive the first clock signal, and a second electrode of the first capacitor is connected to the second node.

5. The shift register unit according to claim 1, wherein the second control node control sub-circuit comprises:

a fourth transistor, wherein a gate electrode of the fourth transistor is connected to the first control node, a first electrode of the fourth transistor is connected to the first voltage terminal to receive the first voltage, and a second electrode of the fourth transistor is connected to the second control node;

a fifth transistor, wherein a gate electrode of the fifth transistor is connected to the second node, a first electrode of the fifth transistor is connected to a second voltage terminal to receive a second voltage, and a second electrode of the fifth transistor is connected to the second control node; and a second capacitor, wherein a first electrode of the second capacitor is connected to the second control node, and a second electrode of the second capacitor is connected to the first node.

6. The shift register unit according to claim 1, wherein the second control sub-circuit comprises a sixth transistor, a gate electrode of the sixth transistor is connected to the second control node, a first electrode of the sixth transistor is connected to the first voltage terminal to receive the first voltage, and a second electrode of the sixth transistor is connected to the first control node.

7. The shift register unit according to claim 1, wherein the first node control sub-circuit comprises:

a seventh transistor, wherein a gate electrode of the seventh transistor is connected to the second control node, a first electrode of the seventh transistor is connected to a second clock signal terminal to receive a second clock signal, and a second electrode of the seventh transistor is connected to the first node;

an eighth transistor, wherein a gate electrode of the eighth transistor is connected to the first control node, a first electrode of the eighth transistor is connected to the first voltage terminal to receive the first voltage, and a second electrode of the eighth transistor is connected to the first node; and a third capacitor, wherein a first electrode of the third capacitor is connected to the first node, and a second electrode of the third capacitor is connected to the first voltage terminal to receive the first voltage.

8. The shift register unit according to claim 1, further comprising a second control maintaining circuit, wherein the second control maintaining circuit is configured to perform noise reduction on the output terminal under control of the level of the first control node.

9. The shift register unit according to claim 8, wherein the second control maintaining circuit comprises:

a ninth transistor, wherein a gate electrode of the ninth transistor is connected to the first control node, a first electrode of the ninth transistor is connected to a second voltage terminal to receive a second voltage, and a second electrode of the ninth transistor is connected to the output terminal; and a fourth capacitor, wherein a first electrode of the fourth capacitor is connected to a second clock signal terminal to receive a second clock signal, and a second electrode of the fourth capacitor is connected to the first control node.

10. The shift register unit according to claim 8, wherein the second control maintaining circuit comprises:

a ninth transistor, wherein a gate electrode of the ninth transistor is connected to the first control node, a first electrode of the ninth transistor is connected to a second voltage terminal to receive a second voltage, and a second electrode of the ninth transistor is connected to the output terminal; and a fourth capacitor, wherein a first electrode of the fourth capacitor is connected to the first control node, and a second electrode of the fourth capacitor is connected to the output terminal.

11. A gate driving circuit, comprising a plurality of cascaded shift register units according to claim 1, wherein an input terminal of each of the shift register units except for a first shift register unit is connected to an output terminal of a previous shift register unit.

12. A display device, comprising the gate driving circuit according to claim 11.

13. A driving method for driving the shift register unit according to claim 1, comprising:

in a first phase, performing first control on the first control node according to the input signal and in response to the first clock signal by the input circuit, performing the first control on the first node under control of the level of the first control node and the first clock signal by the first control circuit, and outputting a first level by the output terminal;

in a second phase, performing second control, different from the first control, on the first node, by the first control circuit, under control of the level of the first control node and the first clock signal, and outputting the first voltage by the output terminal; and in a third phase, performing the second control on the first control node according to the input signal and in response to the first clock signal by the input circuit, performing the first control on the first node under control of the level of the first control node and the first clock signal by the first control circuit, and outputting the first level by the output terminal, wherein the first level is lower than the first voltage.

14. The driving method for driving the shift register unit according to claim 13, wherein in a case where the shift register unit comprises a second control maintaining circuit, the third phase of the driving method further comprises:

performing noise reduction on the output terminal under control of the level of the first control node by the second control maintaining circuit.

15. The shift register unit according to claim 1, wherein the input circuit comprises a first transistor, a gate electrode of the first transistor is connected to a first clock signal terminal to receive the first clock signal, a first electrode of the first transistor is connected to an input terminal to receive the input signal, and a second electrode of the first transistor is connected to the first control node.

16. The shift register unit according to claim 15, wherein the output circuit comprises a second transistor, a gate electrode of the second transistor is connected to the first node, a first electrode of the second transistor is connected to the first voltage terminal to receive the first voltage, and a second electrode of the second transistor is connected to the output terminal.

17. The shift register unit according to claim 1, wherein the output circuit comprises a second transistor,
- a gate electrode of the second transistor is connected to the first node, a first electrode of the second transistor is connected to the first voltage terminal to receive the first voltage, and a second electrode of the second transistor is connected to the output terminal.

18. The shift register unit according to claim 1, further comprising a second control maintaining circuit,
- wherein the second control maintaining circuit is configured to perform noise reduction on the output terminal under control of the level of the first control node.

19. The shift register unit according to claim 18, wherein the input circuit comprises a first transistor, a gate electrode of the first transistor is connected to a first clock signal terminal to receive the first clock signal, a first electrode of the first transistor is connected to an input terminal to receive the input signal, and a second electrode of the first transistor is connected to the first control node;
- the output circuit comprises a second transistor, a gate electrode of the second transistor is connected to the first node, a first electrode of the second transistor is connected to the first voltage terminal to receive the first voltage, and a second electrode of the second transistor is connected to the output terminal;
- the second node control sub-circuit comprises:
- a third transistor, wherein a gate electrode of the third transistor is connected to the first control node, a first electrode of the third transistor is connected to the first voltage terminal to receive the first voltage, and a second electrode of the third transistor is connected to the second node; and
- a first capacitor, wherein a first electrode of the first capacitor is connected to the first clock signal terminal to receive the first clock signal, and a second electrode of the first capacitor is connected to the second node;
- the second control node control sub-circuit comprises:
- a fourth transistor, wherein a gate electrode of the fourth transistor is connected to the first control node, a first electrode of the fourth transistor is connected to the first voltage terminal to receive the first voltage, and a second electrode of the fourth transistor is connected to the second control node;
- a fifth transistor, wherein a gate electrode of the fifth transistor is connected to the second node, a first electrode of the fifth transistor is connected to a second voltage terminal to receive a second voltage, and a second electrode of the fifth transistor is connected to the second control node; and
- a second capacitor, wherein a first electrode of the second capacitor is connected to the second control node, and a second electrode of the second capacitor is connected to the first node;
- the second control sub-circuit comprises a sixth transistor, a gate electrode of the sixth transistor is connected to the second control node, a first electrode of the sixth transistor is connected to the first voltage terminal to receive the first voltage, and a second electrode of the sixth transistor is connected to the first control node;
- the first node control sub-circuit comprises:
- a seventh transistor, wherein a gate electrode of the seventh transistor is connected to the second control node, a first electrode of the seventh transistor is connected to a second clock signal terminal to receive a second clock signal, and a second electrode of the seventh transistor is connected to the first node;
- an eighth transistor, wherein a gate electrode of the eighth transistor is connected to the first control node, a first electrode of the eighth transistor is connected to the first voltage terminal to receive the first voltage, and a second electrode of the eighth transistor is connected to the first node; and
- a third capacitor, wherein a first electrode of the third capacitor is connected to the first node, and a second electrode of the third capacitor is connected to the first voltage terminal to receive the first voltage; and
- the second control maintaining circuit comprises:
- a ninth transistor, wherein a gate electrode of the ninth transistor is connected to the first control node, a first electrode of the ninth transistor is connected to the second voltage terminal to receive the second voltage, and a second electrode of the ninth transistor is connected to the output terminal; and
- a fourth capacitor, wherein a first electrode of the fourth capacitor is connected to the second clock signal terminal to receive the second clock signal, and a second electrode of the fourth capacitor is connected to the first control node; or
- the first electrode of the fourth capacitor is connected to the first control node, and the second electrode of the fourth capacitor is connected to the output terminal.

* * * * *